(12) United States Patent
Ko et al.

(10) Patent No.: US 7,342,180 B2
(45) Date of Patent: Mar. 11, 2008

(54) FLEXIBLE PRINTED CIRCUIT AND LIQUID CRYSTAL DISPLAY DEVICE USING SAME

(75) Inventors: Bing-Hoang Ko, Miao-Li (TW); Feng-Yi Chang, Miao-Li (TW); Chih-Wen Wu, Miao-Li (TW)

(73) Assignee: Innolux Display Corp., Miao-Li County (TW)

( * ) Notice: Subject to any disclaimer, the term of this patent is extended or adjusted under 35 U.S.C. 154(b) by 26 days.

(21) Appl. No.: 11/288,749

(22) Filed: Nov. 28, 2005

(65) Prior Publication Data

US 2006/0152662 A1 Jul. 13, 2006

(30) Foreign Application Priority Data

Nov. 26, 2004 (TW) .............................. 93136459 A

(51) Int. Cl.
*H05K 1/16* (2006.01)
(52) U.S. Cl. ...................................... 174/260; 174/261
(58) Field of Classification Search ................ 174/254, 174/250, 260, 261; 349/149, 150, 151, 152
See application file for complete search history.

(56) References Cited

U.S. PATENT DOCUMENTS

| | | | | |
|---|---|---|---|---|
| 4,000,558 A | * | 1/1977 | Cahill | 29/850 |
| 5,194,934 A | | 3/1993 | Yamazaki et al. | |
| 5,612,514 A | * | 3/1997 | Lam | 174/261 |
| 6,300,997 B1 | * | 10/2001 | Saito et al. | 349/149 |
| 6,319,019 B1 | * | 11/2001 | Kwon et al. | 439/67 |
| 6,657,606 B2 | * | 12/2003 | Kang et al. | 345/87 |

* cited by examiner

*Primary Examiner*—Ishwar (I. B.) Patel
(74) *Attorney, Agent, or Firm*—Wei Te Chung

(57) ABSTRACT

An exemplary liquid crystal display device (200) includes a liquid crystal display panel (21), and a flexible printed circuit (2) joined to the liquid crystal display panel. The flexible printed circuit includes a substrate (20). The substrate includes a plurality of first conductive lines (210) and second conductive lines (230). The first conductive lines include a plurality of first patches (220). The second conductive lines include a plurality of second patches (240). The first patches are arranged side by side oppositely oriented relative to each other in alternating fashion. The second patches are arranged side by side oppositely oriented relative to each other in alternating fashion.

17 Claims, 6 Drawing Sheets

FLEXIBLE PRINTED CIRCUIT AND LIQUID CRYSTAL DISPLAY DEVICE USING SAME

FIELD OF THE INVENTION

The present invention relates to flexible printed circuits (FPCs) for liquid crystal display (LCD) devices, and more particularly to a flexible printed circuit with increased signal bandwidth and a liquid crystal display device using the same.

GENERAL BACKGROUND

Liquid crystal displays are commonly used as display devices for compact electronic apparatuses, because they not only are very thin but also provide good quality images with little power.

A typical LCD device includes a liquid crystal display panel, and a backlight module disposed adjacent to the liquid crystal display panel. A plurality of source electrodes and a plurality of gate electrodes are disposed on the liquid crystal display panel. Each source electrode includes a source electrode driving integrated circuit (IC). Each gate electrode includes a gate electrode driving IC. An FPC is generally used in an LCD device for joining the liquid crystal display panel and a printed circuit board (PCB).

Referring to FIG. 6, a conventional LCD 100 includes a liquid crystal display panel 11, a backlight module 150 disposed adjacent to the liquid crystal display panel 11, a frame 160 containing the backlight module 150, a PCB 130 disposed adjacent to the frame 160, an FPC 1 joining the liquid crystal display panel 11 and the PCB 130, and a driving IC 15 disposed on the FPC 1.

Referring to FIG. 7, the FPC 1 includes a substrate 10, a plurality of input lines 120, a plurality of output lines, 140, and a resin layer 16. The substrate 10 includes a first joint part 12 for joining to the PCB 130, and a second joint part 14 for joining to the liquid crystal display panel 11. The input lines 120 are formed on the first joint part 12. The output lines 140 are formed on the second joint part 14. The input lines 120 and output lines 140 are electrically conductive.

The driving IC 15 is disposed in a middle region of the substrate 10. The input lines 120 of the FPC 1 are joined to the PCB 130, and are also joined to the driving IC 15 for signal transmission from the PCB 130 to the driving IC 15. The output lines 140 of the FPC 1 are joined to the liquid crystal display panel 11, and are also joined to the driving IC 15 for signal transmission from the driving IC 15 to the liquid crystal display panel 11. The resin layer 16 covers areas of both the input lines 120 and the output lines 140 that are around the driving IC 15. An aligning mark 18 is formed beside the output lines 140.

The input lines 120 and the output lines 140 are all rectangular, and a certain distance must be provided between each two adjacent input lines 120 and each two adjacent output lines 140 in order to avoid short circuits. When the number of driving signals is large, the areas of the first joint part 12 and the second joint part 14 must be correspondingly large in order to contain the large number of input and output lines 120, 140 that are needed for providing the large signal bandwidth. This results in a correspondingly very wide FPC 1, and may render the LCD 100 unsuitable for certain compact electronic apparatuses.

What is needed, therefore, is a flexible printed circuit and a liquid crystal display device using the same that overcome the above-described deficiencies.

SUMMARY

In an exemplary embodiment, a flexible printed circuit includes a substrate. The substrate includes a plurality of first conductive lines and second conductive lines. The first conductive lines include a plurality of first patches. The second conductive lines include a plurality of second patches. The first patches are arranged side by side oppositely oriented relative to each other in alternating fashion. The second patches are arranged side by side oppositely oriented relative to each other in alternating fashion. The first conductive lines may for example be input lines, and the second conductive lines may for example be output lines.

Assuming that a size of the FPC of the exemplary embodiment is the same as a size of a conventional FPC, the amount of input lines of the FPC of the exemplary embodiment can be approximately twice the amount of input lines of the conventional FPC. Similarly, the amount of output lines of the FPC of the exemplary embodiment can be approximately twice the amount of output lines of the conventional FPC. Thus, the signal bandwidth of the FPC of the exemplary embodiment can be approximately twice the signal bandwidth of the conventional FPC.

In another exemplary embodiment, a liquid crystal display device includes a liquid crystal display panel and a flexible printed circuit joined to the liquid crystal display panel. The flexible printed circuit includes a substrate. The substrate includes a plurality of first conductive lines and second conductive lines. The first conductive lines include a plurality of first patches. The second conductive lines include a plurality of second patches. The first patches are arranged side by side oppositely oriented relative to each other in alternating fashion. The second patches are arranged side by side oppositely oriented relative to each other in alternating fashion.

Other advantages and novel features will become more apparent from the following detailed description when taken in conjunction with the accompanying drawings.

DETAILED DESCRIPTION OF PREFERRED EMBODIMENTS

Reference will now be made to the drawings to describe the preferred embodiments in detail.

Figure 1:
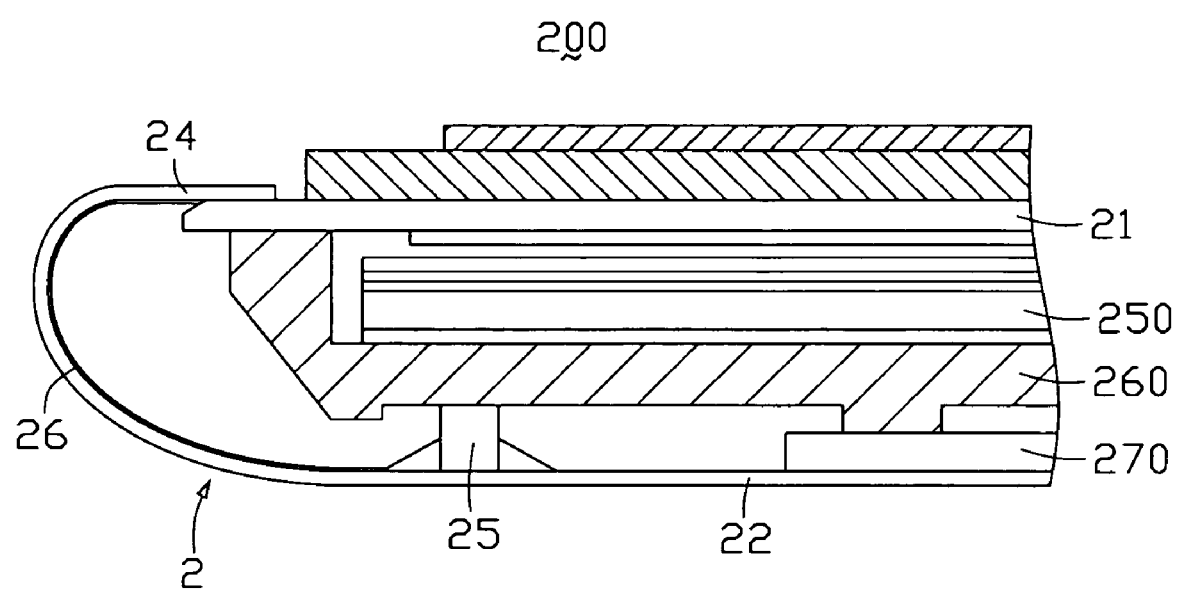
FIG. 1 is a schematic, side cross-sectional view of part of a liquid crystal display device using an FPC according to a first embodiment of the present invention.

Referring to FIG. 1, an LCD 200 includes a liquid crystal display panel 21, a backlight module 250 disposed adjacent to the liquid crystal display panel 21, a frame 260 containing the backlight module 250, a PCB 270 disposed adjacent to the frame 260, an FPC 2 interconnecting the liquid crystal display panel 21 and the PCB 270, and a driving IC 25 disposed on the FPC 2.

Figure 2:
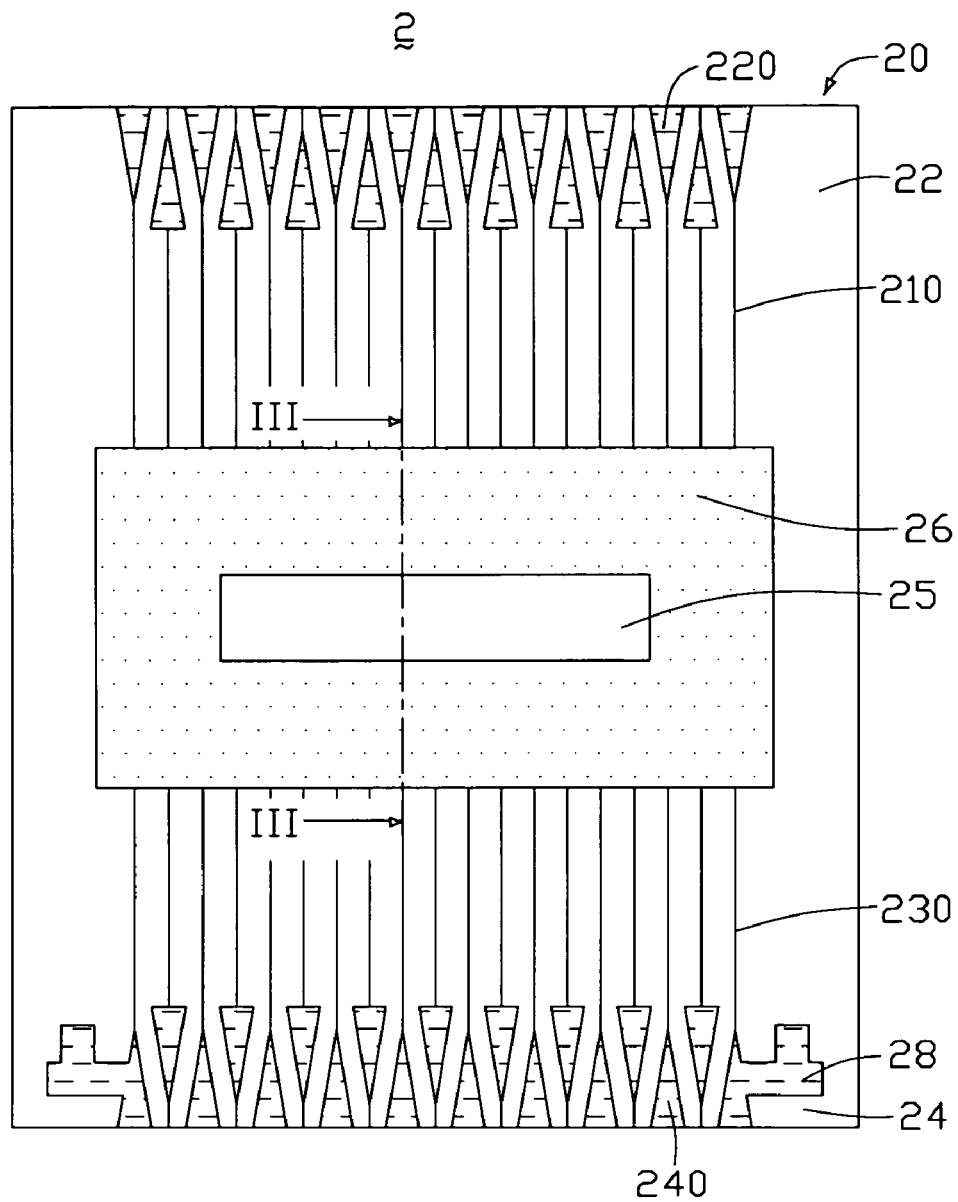
FIG. 2 is a schematic, top plan view of the FPC of FIG. 1 when the FPC is laid out flat.

Referring to FIG. 2, the FPC 2 includes a substrate 20, a plurality of electrically conductive input lines 210 having input patches 220, a plurality of electrically conductive output lines 230 having output patches 240, and a resin layer 26. The substrate 20 includes a first joint part 22 for connecting to the PCB 270, and a second joint part 24 for connecting to the liquid crystal display panel 21. The input patches 220 are formed on the first joint part 22. The output patches 240 are formed on the second joint part 24.

Figure 3:
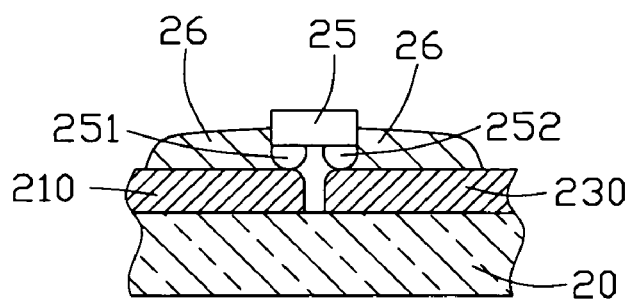
FIG. 3 is a schematic, side cross-sectional view corresponding to line III-III of FIG. 2.

Referring to FIG. 3, the driving IC 25 is disposed in a middle region of the substrate 20. Outer ends of the input lines 210 of the FPC 2 are connected to the PCB 270. Inner ends of the input lines 210 are joined to a plurality of pins 251 of the driving IC 25. Thus the input lines 210 provide signal transmission from the PCB 270 to the driving IC 25. Outer ends of the output lines 230 of the FPC 2 are connected to the liquid crystal display panel 21. Inner ends of the output lines 230 are joined to a plurality of pins 252 of the driving IC 25. Thus the output lines 230 provide signal transmission from the driving IC 25 to the liquid crystal display panel 21. The resin layer 26 covers portions of the input lines 210 and the output lines 230 around the driving IC 25. The resin layer 26 can fix the driving IC 25 in place. An aligning mark 28 is formed beside the output patches 240.

The input patches 220 and the output patches 240 are all shaped as isosceles triangles. In the illustrated embodiment, the input patches 220 and the output patches 240 all have the same size and shape. The input patches 220 are arranged generally in a row. Each input patch 220 has a point between the two sides of the triangle that are the same length. The points of every second input patch 220 in the row of input patches 220 face toward the outside of the substrate 20. The points of every other input patch 220 in the row of input patches 220 face toward the driving IC 25. That is, each two adjacent input patches 220 are oriented diametrically opposite each other. In other words, in general, a portion of one input patch 220 having a smaller width is opposite a portion of an adjacent input patch 220 having a larger width. Thus the row of input patches 220 comprises oppositely oriented input patches 220 arranged side by side in alternating fashion. The output patches 240 are arranged in a row, in essentially the same way that the input patches 220 are arranged.

Each input patch 220 has a base side opposite from the point. Each output patch 240 has a base side opposite from the point. A width of the base side of each input patch 220 is equal to a width of the base side of each output patch 240. Distances between adjacent input patches 220 are the same. Distances between adjacent output patches 240 are the same.

The width of the base side of each input conductive pattern 220 is the same as the width of each input line 120 of the above-described conventional FPC 1. Similarly, the width of the base side of each output patch 240 is the same as the width of each output line 140 of the FPC 1. The distance between each two adjacent input patches 220 is similar to or somewhat less than the distance between each two adjacent input lines 120 of the FPC 1. The distance between each two adjacent output patches 240 is similar to or somewhat less than the distance between each two adjacent output lines 140 of the FPC 1. In general, a region that can contain only one input line 120 is able to contain two adjacent input patches 220. In other words, assuming that a size of the FPC 2 is the same as a size of the FPC 1, the amount of input lines 210 of the FPC 2 can be approximately twice the amount of input lines 120 of the FPC 1. Similarly, the amount of output lines 230 of the FPC 2 can be approximately twice the amount of output lines 140 of the FPC 1. Thus, the signal bandwidth of the FPC 2 can be approximately twice the signal bandwidth of the FPC 1.

Figure 4:
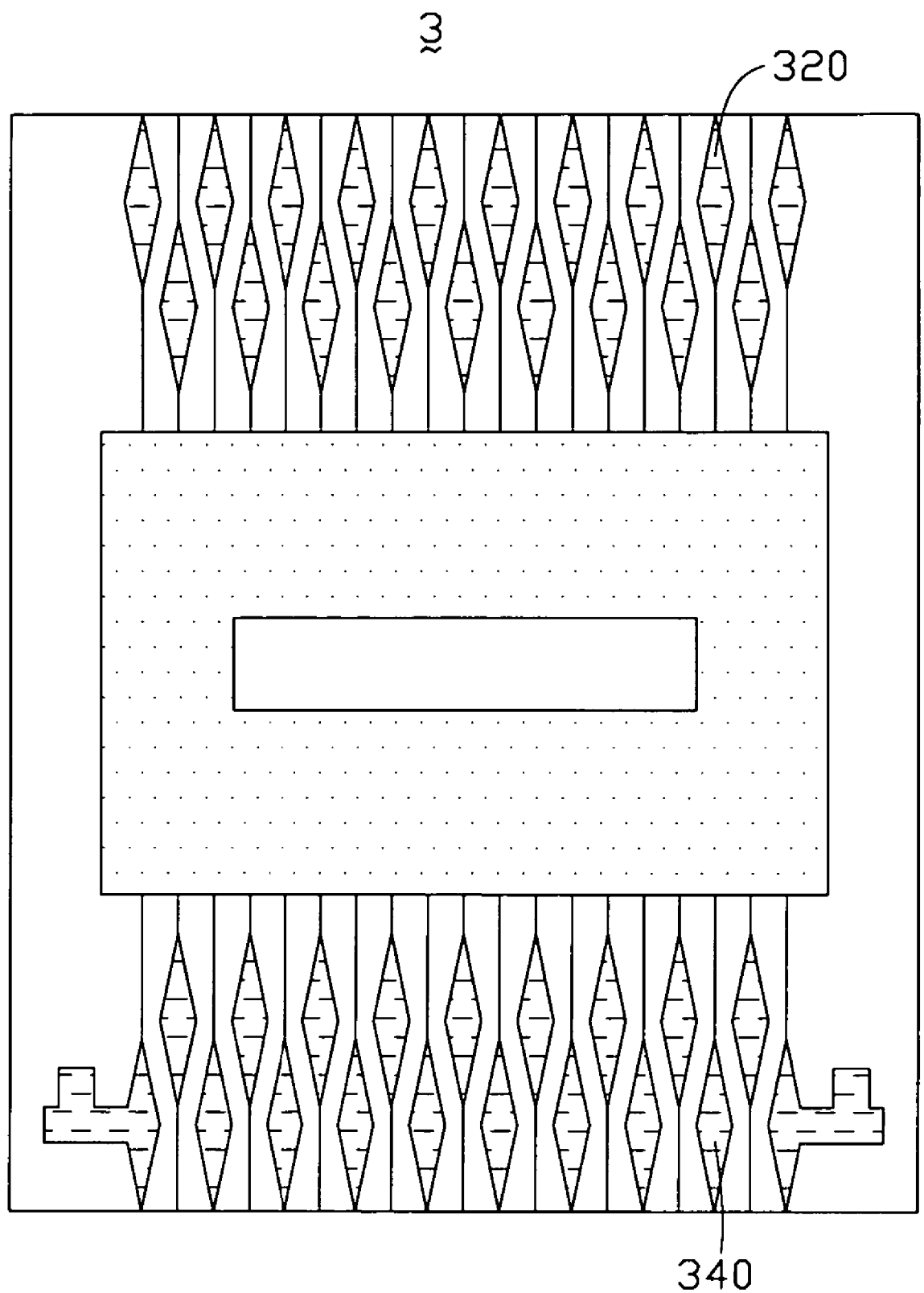
FIG. 4 is a schematic, top plan view of an FPC according to a second preferred embodiment of the present invention.

Referring to FIG. 4, an FPC 3 of the second embodiment of the present invention is similar to the FPC 2 of the first embodiment. However, the FPC 3 includes a plurality of electrically conductive input lines having input patches 320, and a plurality of electrically conductive output lines having output patches 340. The input patches 320 and the output patches 340 are all shaped as diamonds. In the illustrated embodiment, the input patches 320 and the output patches 340 all have the same size and shape. The input patches 320 are arranged generally in two rows. Each input patch 320 in each row is located generally midway between two nearest input patches 320 in the other row. Thus the two rows of input patches 220 have the input patches 220 arranged in a staggered fashion. The output patches 340 are arranged generally in two rows, in essentially the same way that the input patches 220 are arranged.

A maximum transverse width of each input patch 320 is equal to a maximum transverse width of each output patch 340. Distances between adjacent input patches 320 are the same. Distances between adjacent output patches 340 are the same.

The maximum transverse width of each input patch 320 is the same as the width of each input line 120 of the above-described conventional FPC 1. Similarly, the maximum transverse width of each output patch 340 is the same as the width of each output line 140 of the FPC 1. The distance between each two adjacent input patches 320 is similar to or somewhat less than the distance between each two adjacent input lines 120 of the FPC 1. The distance between each two adjacent output patches 340 is similar to or somewhat less than the distance between each two adjacent output lines 140 of the FPC 1. In general, a region that can contain only one input line 120 is able to contain two adjacent input patches 320. In other words, assuming that a size of the FPC 3 is the same as the size of the FPC 1, the amount of input lines of the FPC 3 can be approximately twice the amount of input lines 120 of the FPC 1. Similarly, the amount of output lines of the FPC 3 can be approximately twice the amount of output lines 140 of the FPC 1. Thus, the signal bandwidth of the FPC 3 can be approximately twice the signal bandwidth of the FPC 1.

Figure 5:
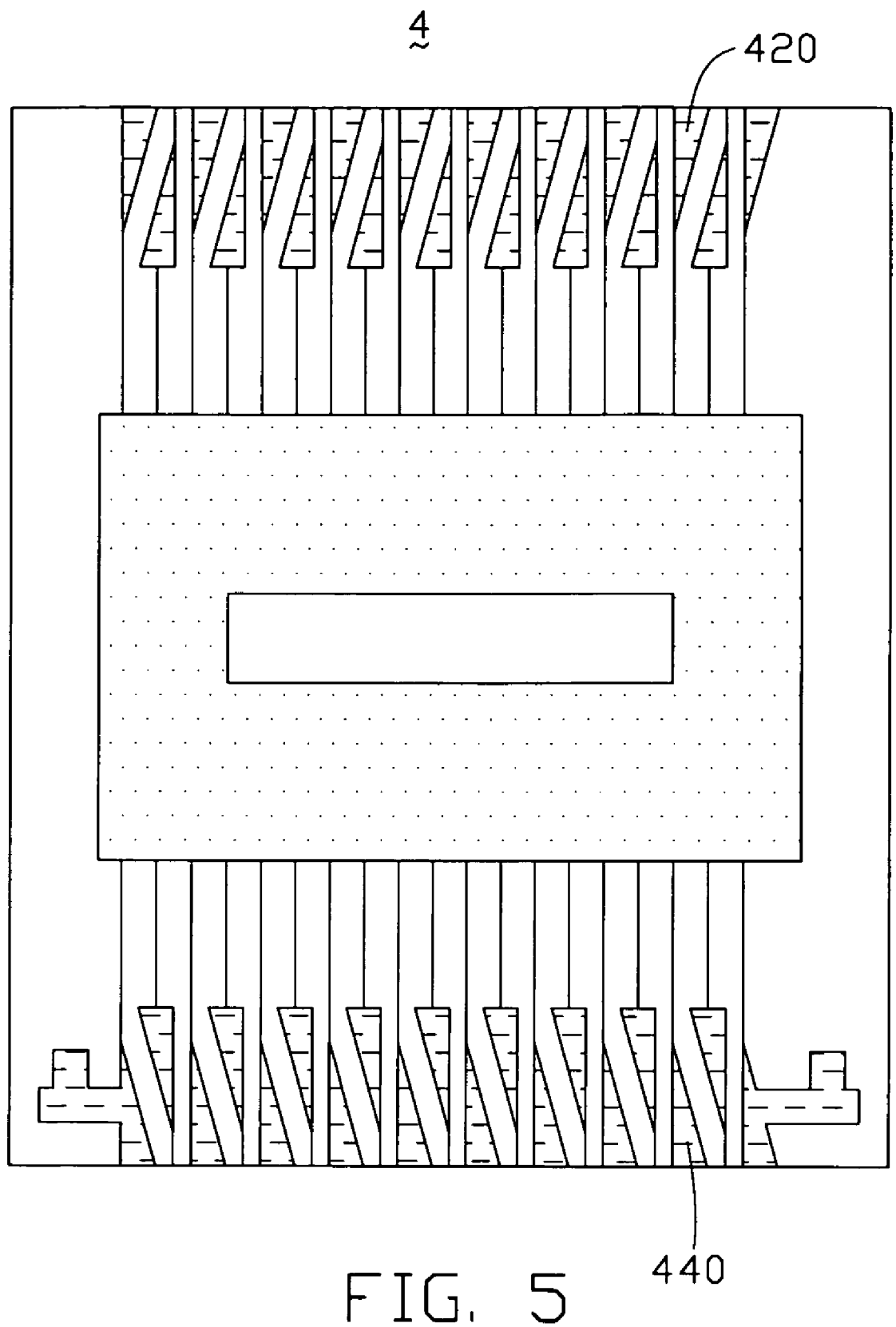
FIG. 5 is a schematic, top plan view of an FPC according to a third preferred embodiment of the present invention.
Figure 6:
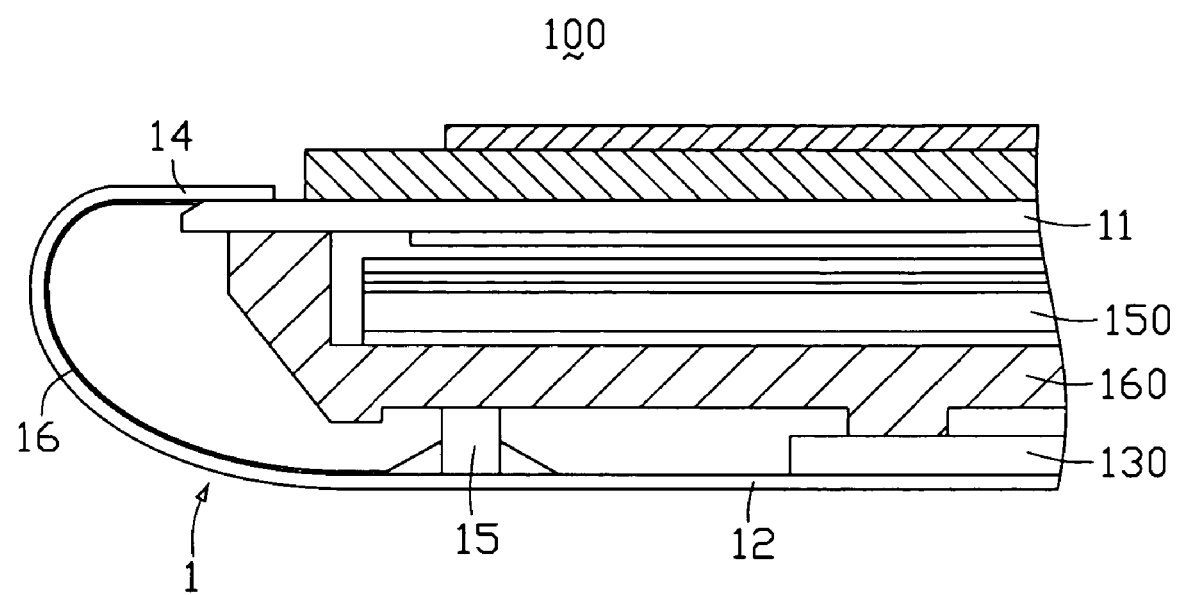
FIG. 6 is a schematic, side cross-sectional view of part of a conventional liquid crystal display device including an FPC.
Figure 7:
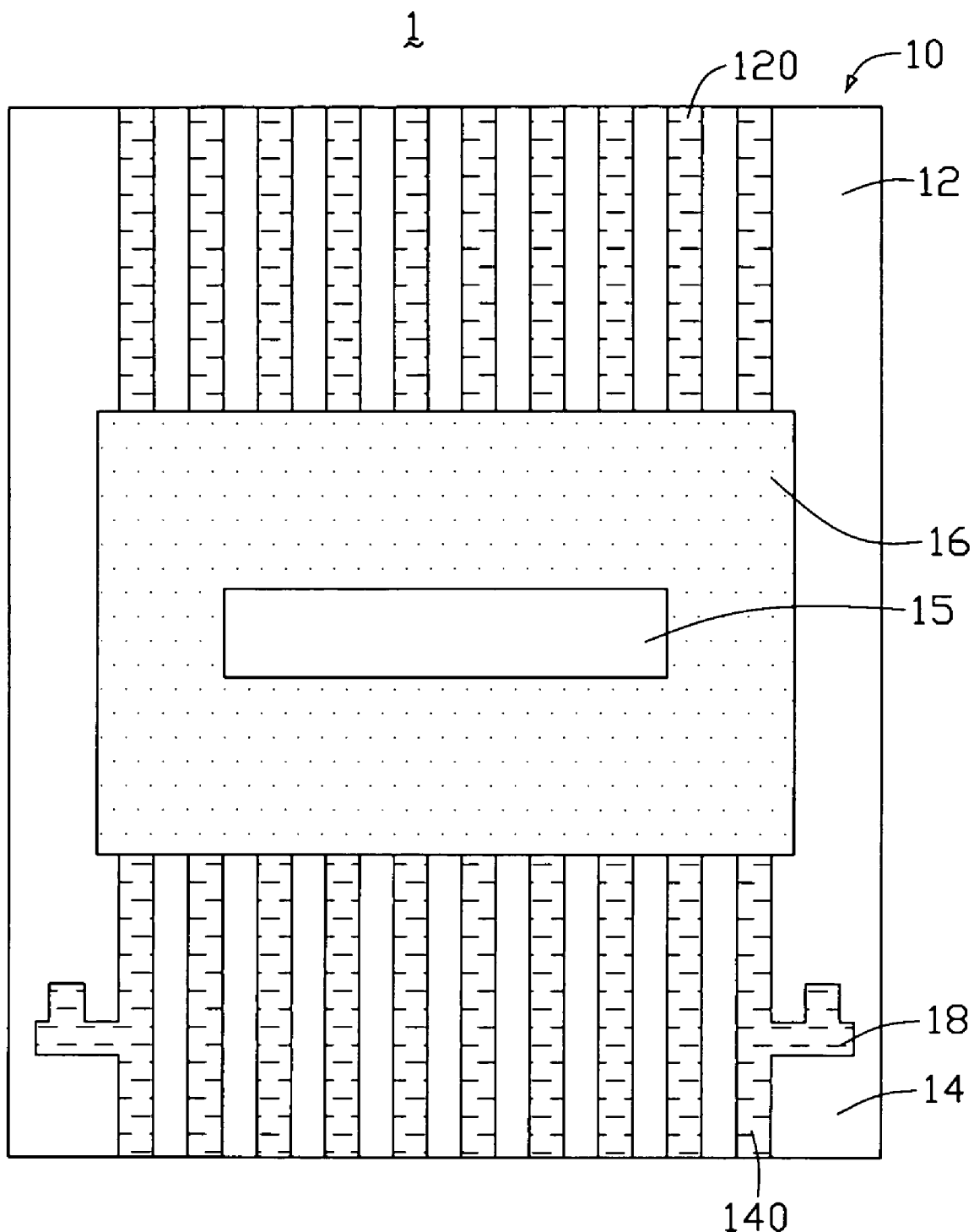
FIG. 7 is a schematic, top plan view of the FPC of FIG. 6 when the FPC is laid out flat.

Referring to FIG. 5, an FPC 4 of the third embodiment of the present invention is similar to the FPC 2 of the first embodiment. However, the FPC 4 includes a plurality of electrically conductive input lines having input patches 420, and a plurality of electrically conductive output lines having output patches 440. The input patches 420 and the output patches 440 are all shaped as right-angled triangles. The input patches 420 are arranged generally in a row. Each input patch 420 has a point that is distalmost from the right angle. The points of every second input patch 420 in the row of input patches 420 face toward the outside of a substrate (not labeled) of the FPC 4. The points of every other input patch 420 in the row of input patches 420 face toward a central driving IC (not labeled). That is, each two adjacent input patches 420 are oriented diametrically opposite each other. In other words, in general, a portion of one input patch 420 having a smaller width is opposite a portion of an adjacent input patch 420 having a larger width. Thus the row of input patches 420 comprises oppositely oriented input patches 420 arranged side by side in alternating fashion. The output patches 440 are arranged in a row, in essentially the same way that the input patches 420 are arranged.

Each input patch 420 has a base side opposite from the point. Each output patch 440 has a base side opposite from the point. A width of the base side of each input patch 420 is equal to a width of the base side of each output patch 440. Distances between adjacent input patches 420 are the same. Distances between adjacent output patches 440 are the same.

The width of the base side of each input patch 420 is the same as the width of each input line 120 of the above-described conventional FPC 1. Similarly, the width of the base side of each output patch 440 is the same as the width of each output line 140 of the FPC 1. The distance between each two adjacent input patches 420 is similar to or somewhat less than the distance between each two adjacent input lines 120 of the FPC 1. The distance between each two adjacent output patches 440 is similar to or somewhat less than the distance between each two adjacent output lines 140 of the FPC 1. In general, a region that can contain only one input line 120 is able to contain two adjacent input patches 420. In other words, assuming that a size of the FPC 4 is the same as the size of the FPC 1, the amount of input lines of the FPC 4 can be approximately twice the amount of input lines 120 of the FPC 1. Similarly, the amount of output lines of the FPC 4 can be approximately twice the amount of output lines 140 of the FPC 1. Thus, the signal bandwidth of the FPC 4 can be approximately twice the signal bandwidth of the FPC 1.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A flexible printed circuit, comprising:
   a substrate comprising a plurality of first conductive lines and second conductive lines, wherein:
   the first conductive lines comprise a plurality of first patches;
   the second conductive lines comprise a plurality of second patches;
   the first patches and the second patches are triangular;
   the first patches are arranged side by side oppositely oriented relative to each other in alternating fashion; and
   the second patches are arranged side by side oppositely oriented relative to each other in alternating fashion.

2. The flexible printed circuit as claimed in claim 1, wherein the first patches and the second patches are isosceles triangles.

3. The flexible printed circuit as claimed in claim 1, wherein the triangles are right-angled triangles.

4. The flexible printed circuit as claimed in claim 1, wherein the substrate further comprises an aligning mark adjacent the second patches.

5. The flexible printed circuit as claimed in claim 1, further comprising a driving integrated circuit (IC) at a middle region of the substrate.

6. The flexible printed circuit as claimed in claim 5, further comprising a resin layer covering portions of the first conductive lines and the second conductive lines around the driving IC.

7. The flexible printed circuit as claimed in claim 5, wherein the driving IC is joined to the first conductive lines and the second conductive lines.

8. The flexible printed circuit as claimed in claim 1, wherein the triangle of each of the first and second patches defines a base side and a point opposite the base side, the point of each of the first patches is located generally between the base sides of the two adjacent first patches, and the point of each of the second patches is located generally between the base sides of the two adjacent second patches.

9. The flexible printed circuit as claimed in claim 1, wherein the triangle of each of the first and second patches defines a base side and a point opposite the base side, the base side of each of the first patches is located generally between the points of the two adjacent first patches, and the base side of each of the second patches is located generally between the points of the two adjacent second patches.

10. A flexible printed circuit, comprising:
    a substrate comprising a plurality of first conductive lines and second conductive lines, wherein:
    the first conductive lines comprise a plurality of first patches;
    the second conductive lines comprise a plurality of second patches;
    the first patches and the second patches are triangular;
    the first patches are arranged generally in two rows, the first patches in a first one of the two rows of first patches being oppositely oriented relative to the first patches in a second one of the two rows of first patches, with each first patch in the first row being located generally between two nearest first patches in the second row; and
    the second patches are arranged generally in two rows, the second patches in a first one of the two rows of second patches being oppositely oriented relative to the second patches in a second one of the two rows of second patches, with each second patch in the first row being located generally between two nearest second patches in the second row.

11. The flexible printed circuit as claimed in claim 10, wherein the substrate further comprises an aligning mark adjacent the second patches.

12. The flexible printed circuit as claimed in claim 10, further comprising a driving integrated circuit (IC) at a middle region of the substrate.

13. The flexible printed circuit as claimed in claim 12, further comprising a resin layer covering portions of the first conductive lines and the second conductive lines around the driving IC.

14. The flexible printed circuit as claimed in claim 12, wherein the driving IC is joined to the first conductive lines and the second conductive lines.

15. The flexible printed circuit as claimed in claim 10, wherein the first patches and the second patches are isosceles triangles.

16. The flexible printed circuit as claimed in claim 10, wherein the triangles are isosceles triangles.

17. A flexible printed circuit, comprising:
    a substrate comprising a plurality of first conductive lines and second conductive lines, wherein:
    the first conductive lines comprise a plurality of first patches;
    the second conductive lines comprise a plurality of second patches;

the first patches and the second patches are triangular, the triangle defining a base side and a point opposite the base side;

the first patches are arranged generally in two rows, the points of the first patches in a first one of the rows pointing in a same first direction, the points of the first patches in a second one of the rows pointing in a same second direction that is opposite to the first direction, with each first patch in the first row being located generally between two nearest first patches in the second row; and the second patches are arranged generally in two rows, the points of the second patches in a first one of the rows pointing in a same third direction, the points of the second patches in a second one of the rows pointing in a same fourth direction that is opposite to the third direction, with each second patch in the first row being located generally between two nearest second patches in the second row.

* * * * *